United States Patent [19]

Proebsting

[11] 4,406,954

[45] Sep. 27, 1983

[54] SHARED QUIET LINE FLIP-FLOP

[75] Inventor: Robert J. Proebsting, Dallas, Tex.

[73] Assignee: Mostek Corporation, Carrollton, Tex.

[21] Appl. No.: 227,054

[22] Filed: Jun. 2, 1980

[51] Int. Cl.³ .................. G11C 7/02; H03K 17/16; H03K 3/013; H03K 3/356

[52] U.S. Cl. ...................... 307/200 B; 307/279; 307/443; 365/206

[58] Field of Search ............ 307/200 B, 443, 450, 307/453, 449, 463, 279, 238.2; 365/206, 214, 230, 231, 233

[56] References Cited

U.S. PATENT DOCUMENTS

| | | | |
|---|---|---|---|
| 3,942,164 | 3/1976 | Dunn | 365/214 |
| 4,110,842 | 8/1978 | Sarkissian et al. | 307/279 X |
| 4,168,490 | 9/1979 | Stinehelfer | 365/206 |
| 4,230,951 | 10/1980 | Suziki et al. | 307/200 B |
| 4,259,731 | 3/1981 | Moench | 365/206 |
| 4,289,982 | 9/1981 | Smith | 365/230 X |

FOREIGN PATENT DOCUMENTS 55338  5/1977  Japan .................... 365/206

OTHER PUBLICATIONS

Hoffman et al., "An 8K b Random-Access Memory Chip Using the One-Device FET Cell", *IEEE-JSSC*, vol. SC-8, No. 5, pp. 298-305, 10/73.

Lohman, "Applications of MOSFET's in Microelectronics", *SCP and Solid State Technology*, pp. 23-29, 3/66.

Reynolds et al., "Metal-Oxide-Semiconductor (MOS) Integrated Circuits", *Post. Off. Elect. Engrs. J. (G.B.)*, vol. 63, pt. 2, pp. 105-112, 7/70.

Cole et al., "Dynamic Logic Circuit," *IB Tech. Discl. Bull.*, vol. 16, No. 2, p. 567, 7/73.

*Primary Examiner*—Larry N. Anagnos

[57] ABSTRACT

A quiet line flip-flop is connected to a plurality of lines (12, 14) for reducing the effect of capacitive coupling between the lines (12, 14) and a line (18). A node (26) is precharged by a transistor (34) to render conductive transistors (30, 32) which connect the respective lines (12, 14) to a ground node (24). When either of the lines (12, 14) is forced to a voltage above a preset voltage the corresponding transistors (22, 28) are respectively rendered conductive to discharge the node (26) which causes the transistors (30, 32) to be rendered nonconductive thereby disconnecting the lines (12, 14) from the ground node (24).

18 Claims, 1 Drawing Figure

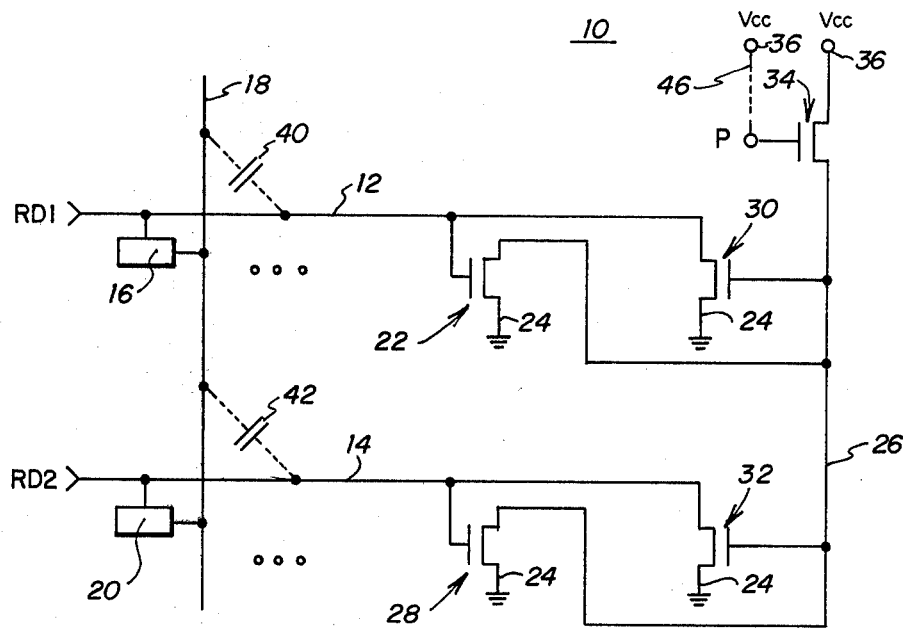

SHARED QUIET LINE FLIP-FLOP

TECHNICAL FIELD

The present invention pertains to semiconductor integrated circuits and more particularly to a circuit for reducing the effect of capacitive coupling between bit lines and unselected row lines in a memory circuit.

BACKGROUND ART

In a semiconductor memory circuit each of the memory cells is accessed by applying a high voltage to a row line that drives an access transistor for the addressed memory cell. The row line is activated by a decoder circuit which is driven in response to a multi-bit memory address signal. The row line selected by the address is driven to a high level by the decoder circuit. Heretofore, it has been a frequent practice to permit the row lines to float at times when another row line is selected by the decoder. But in memory circuits in which multiple bit lines can go high during an active cycle, the capacitive coupling between these bit lines and the floating row lines causes these floating row lines to be capacitively charged positive. This positive voltage can turn on the access transistors for the memory cells connected to the floating row lines. This inadvertent activation of memory cells can destroy the data state stored therein. Thus, when these memory cells are later accessed, erroneous data can be read out.

In view of this problem, there exists a need for a circuit which holds nonselected row lines at a low voltage state to reduce the effect of capacitive coupling but also permits a selected row line to be charged without drawing a substantial amount of current from the row driver transistor. Further this circuit must have a topological configuration adaptable for integration in a very dense integrated memory circuit.

DISCLOSURE OF THE INVENTION

A quiet line flip-flop for a semiconductor memory is provided for reducing capacitively coupled noise on a group of row lines. The quiet line circuit includes means for precharging a first node to a first state in response to a precharge signal where the first node corresponds to the group of row lines. Further circuit means are included for providing a conductive path between each of the row lines and a low voltage node when the first node is charged to a first state. Further circuitry is provided for opening the conductive path between the lines and the low voltage node when at least one of the lines is forced to a voltage above a preset voltage.

BRIEF DESCRIPTION OF THE DRAWINGS

For a more complete understanding of the present invention and the advantages thereof, reference is now made to the following description taken in conjunction with the accompanying drawing in which the FIGURE is a schematic illustration of quiet line flip-flop used in conjunctin with a group of row lines in a semiconductor memory.

DETAILED DESCRIPTION OF THE INVENTION

A representative embodiment of the circuit of the present invention is illustrated in the FIGURE. A quiet line flip-flop 10 is used in conjunction with a group of row lines 12 and 14 within a semiconductor memory. Row line 12 receives a driver signal RD1 which charges the row line to a high state thereby turning on a memory cell 16 which transmits and receives data through a bit line 18. The row line 14 likewise receives a row driver signal RD2 which activates a memory cell 20 for transferring data states through the bit line 18. The row driver signals RD1 and RD2 are generated in response to a memory address as described in co-pending patent application Ser. No. 231,240, filed June 2, 1980 to R. Proebsting.

The quiet line flip-flop 10 includes a discharge transistor 22 which has the gate terminal thereof connected to the row line 12, the source terminal thereof connected to a common ground node 24 and the drain terminal thereof connected to a precharge node 26.

The gate terminal of a discharge transistor 28 is connected to row line 14, the source terminal thereof is connected to ground and the drain terminal thereof is connected to node 26.

A row hold down transistor 30 has the drain terminal thereof connected to the row line 12 and the source terminal thereof connected to the common ground node 24. The gate terminal of row hold down transistor 30 is connected to node 26. A second row hold down transistor 32 has the drain terminal thereof connected to row line 14, the source terminal thereof connected to the common ground node 24 and the gate terminal thereof also connected to node 26.

A precharge transistor 34 is connected to receive a precharge signal P at the gate terminal thereof, the source terminal thereof is connected to node 26 and the drain terminal thereof connected to a power terminal 36 which receives the supply voltage $V_{cc}$.

Stray capacitive coupling between the bit line 18 and the row line 12 is indicated by capacitor 40. Stray capacitive coupling between the bit line 18 and the row line 14 is indicated by capacitor 42.

In a further embodiment of the present invention the precharge signal P is replaced by a connection 46 from the gate terminal of transistor 34 to the power terminal 36 which receives the supply voltage $V_{cc}$. When the connection 46 is in place there is effectively provided a resistive path between $V_{cc}$ and node 26. When transistors 22 and 28 are turned off, node 26 is charged through transistor 34 and transistors 30 and 32 are turned on. But when either of transistors 22 or 28 is turned on, the voltage on node 26 is pulled sufficiently low to turn off transistors 30 and 32. In this condition there will be a current flow path through transistor 34 and the one of transistors 22 and 28 which is turned on. When the voltage on the row line holding transistor 22 or 28 on is removed, both of transistors 22 and 28 are rendered nonconductive and node 26 is again charged through transistor 34 to turn on transistors 30 and 32.

Operation of the circuit of the present invention is now described in reference to the FIGURE. The row lines 12 and 14 are two row lines within a large array of row lines. When bit lines are charged or discharged a voltage can be capacitively coupled into the row lines 12 and 14 by the stray capacitance indicated by capacitors 40 and 42. This capacitively coupled voltage can inadvertently turn on the memory cells 16 and 20 and destroy the data states stored therein. In accordance with the present invention, the circuit 10 is precharged by signal P before the start of each memory cycle. The signal P goes to a high voltage state which drives transistor 34 conductive and precharges node 26 to a high voltage level. The high voltage level on node 26 turns on transistors 30 and 32 thereby connecting the row lines 12 and 14 to the ground node 24. Thus, the row lines 12 and 14 are held affirmatively to ground and any charge induced on the row lines is discharged to the ground node.

But in order for the memory circuit to function as desired, the selected row line must be charged in order to activate the corresponding memory cells. The quiet line circuit 10 thus must be deactivated when it is desired to charge one of the row lines 12 or 14. The transistors 30 and 32 are fabricated to provide a low enough impedance to limit the voltage on the row lines due to capacitive coupling, but to have a high enough impedance to be overcome by the row driver signals. The signals RD1 and RD2 drive the row lines with a typically lower impedance than that of the transistors 30 and 32.

When the signal RD1 forces row line 12 to a voltage above the threshold level of transistor 22, the discharge transistor 22 will be rendered conductive thereby discharging node 26 which in turn deactivates transistors 30 and 32. When transistors 30 and 32 are turned off, the conductive path between the row lines and ground is opened. A similar operation occurs with transistor 28 when row driver signal RD2 forces the voltage on row line 14 above the threshold of transistor 28. Thus, when either one of the row lines 12 and 14 is activated, the node 26 is discharged and the hold down transistors 30 and 32 are turned off.

Prior quiet line flip-flops have been provided in semiconductor memories, but such circuits have included individual precharge nodes for each of the row lines. The use of precharge nodes for each row line often causes the quiet line flip-flop to become the limiting factor in how closely spaced the row lines can be configured. If the spacing of the row lines is increased, this results in a substantial increase in circuit area. The circuit of the present invention provides a quiet line circuit for a plurality of closely spaced row lines and can be implemented such that the overall memory array area is reduced. A reduction in the area used in an integrated circuit offers many advantages including greater yield and lower production costs.

The quiet line flip-flop 10 shown in the FIGURE is disabled when the voltage level on either of the row lines reaches the threshold voltage of its discharge transistor. However, the voltage level at which the node 26 is discharged can be preset to any desired value by the use of well known circuit techniques.

The circuit of the present invention can be utilized in any application where it is desired to hold a plurality of lines at ground to eliminate undesired electrical noise. But when it is desired to drive one of the lines to a high voltage state, the circuit is deactivated to permit such action.

Although one embodiment of the invention has been illustrated in the accompanying drawing and described in the foregoing Detailed Description, it will be understood that the invention is not limited to the embodiment disclosed, but is capable of numerous rearrangements, modifications and substitutions without departing from the scope of the invention.

I claim:

1. A quiet line flip-flop for reducing noise in a plurality of electrically conductive lines, comprising:
    a first node coupled to said lines;
    means for charging said first node to a first state;
    means for charging said first node to a second state when any one of said lines is forced to a voltage above a preset voltage; and
    means for providing a conductive path between each of said lines and a low voltage node when said first node is charged to said first state and for opening said conductive paths when said first node is charged to said second state.

2. The quiet line flip-flop recited in claim 1 wherein said means for charging said first node to a first state comprises a transistor having the drain terminal thereof connected to a power terminal, the source terminal thereof connected to said first node and the gate terminal thereof connected to receive a precharge signal.

3. The quiet line flip-flop recited in claim 1 wherein said means for charging said first node to a first state comprises a transistor having the drain and gate terminals thereof connected to a power terminal and the source terminal thereof connected to said first node.

4. The quiet line flip-flop recited in claim 1 wherein said means for charging said first node to a second state comprises a transistor for each of said lines, each transistor having the gate terminal thereof connected to the corresponding line, the drain terminal thereof connected to said first node and the source terminal thereof connected to a ground node.

5. The quiet line flip-flop recited in claim 1 wherein said means for providing a conductive path comprises a transistor for each of said lines, each transistor having the gate terminal thereof connected to said first node, the drain terminal thereof connected to the corresponding line and the source terminal thereof connected to a ground node.

6. A quiet line flip-flop for reducing noise on a plurality of electrically conductive lines, comprising:
    means for precharging a first node to a first state in response to a precharge signal where said first node is coupled to said lines;
    means for charging said first node to a second state when any one of said lines is forced to a voltage above a preset voltage; and
    means for providing a conductive path between each of said lines and a low voltage node when said first node is charged to said first state and for opening said conductive paths between said lines and said low voltage node when said first node is charged to said second state.

7. The quiet line flip-flop recited to claim 6 wherein said means for precharging said first node comprises a transistor having the drain terminal thereof connected to a power terminal, the source terminal thereof connected to said first node and the gate terminal thereof connected to receive a precharge signal.

8. The quiet line flip-flop recited in claim 6 wherein said means for charging said first node to said second state comprises a transistor for each of said lines, each transistor having the gate terminal thereof connected to the corresponding line, the drain terminal thereof connected to said first node and the source terminal thereof connected to a ground node.

9. The quiet line flip-flop recited in claim 6 wherein said means for providing a conductive path comprises a transistor for each of said lines, each transistor having the gate terminal thereof connected to said first node, the drain terminal thereof connected to the corresponding line and the source terminal thereof connected to a ground node.

10. A quiet line flip-flop for reducing noise on a plurality of electrically conductive lines, comprising:
- a resistive path connecting a power terminal for charging a first node to a first state, the first node is coupled to said lines;
- means for charging said first node to a second state when any one of said lines is forced to a voltage above a preset voltage; and
- means for providing a conductive path between each of said lines and a low voltage node when said first node is charged to said first state and for opening said conductive paths when said first node is charged to said second state.

11. The quiet line flip-flop recited in claim 10 wherein said resistive path comprises a transistor having the gate and drain terminals thereof connected to a power terminal and the source terminal thereof connected to said first node.

12. The quiet line flip-flop recited in claim 10 wherein said means for charging said first node to said second state comprises a transistor for each of said lines, each transistor having the gate terminal thereof connected to the corresponding line, the drain terminal thereof connected to said first node and the source terminal thereof connected to a ground node.

13. The quiet line flip-flop recited in claim 10 wherein said means for providing a conductive path comprises a transistor for each of said lines, each transistor having the gate terminal thereof connected to said first node, the drain terminal thereof connected to the corresponding line and the source terminal thereof connected to a ground node.

14. A quiet line flip-flop for reducing noise on a plurality of electrically conductive lines, comprising:
- a first transistor having the gate terminal thereof connected to receive a precharge signal, the source terminal thereof connected to a first node which is coupled to said lines and the drain terminal thereof connected to a power terminal for precharging said first node upon receipt of said precharge signal;
- a second transistor for each of said lines, each second transistor having the gate terminal thereof connected to said first node, the drain terminal thereof connected to the corresponding line and the source terminal thereof connected to a ground node for connecting the corresponding line to said ground node; and
- a third transistor for each of said lines, each third transistor having the gate terminal thereof connected to the corresponding line, the drain terminal thereof connected to said first node and the source terminal thereof connected to a ground node for discharging said first node when any one of said lines is forced to a voltage above a preset voltage.

15. A quiet line flip-flop for reducing noise on a plurality of electrically conductive lines, comprising:
- A first transistor having the gate and drain terminals thereof connected to a power terminal, and the source terminal thereof connected to a first node which is coupled to said lines, for charging said first node;
- a second transistor for each of said lines, each second transistor having the gate terminal thereof connected to said first node, the drain terminal thereof connected to the corresponding line and the source terminal thereof connected to a ground node for connecting the corresponding line to said ground node; and
- a third transistor for each of said lines, each third transistor having the gate terminal thereof connected to the corresponding line, the drain terminal thereof connected to said first node and the source terminal thereof connected to a ground node for discharging said first node when any one of said lines is forced to a voltage above a preset voltage.

16. A method for reducing noise on a plurality of electrically conductive lines, comprising the steps of:
- providing a conductive path between each of said lines and low voltage node when a first node is charged to a first state; and
- opening said conductive path between each of said lines and said low voltage node when at least one of said lines is forced to a voltage above a preset voltage.

17. A method for reducing noise on a plurality of electrically conductive lines, comprising the steps of:
- charging a first node to a first state in responseto a precharge signal;
- providing a conductive path between each of said lines and a low voltage node when said first node is charged to said first state;
- charging said first node to a second state when any one of said lines is forced to a voltage above a preset voltage; and
- opening said conductive paths when said first node is at said second voltage state.

18. A method for reducing noise in a plurality of electrically conductive lines, comprising the steps of:
- providing a resistive path between a power terminal and a first node;
- providing a conductive path between each of said lines and a low voltage node when said first node is at a first voltage state;
- driving said first node to a second voltage state when any one of said lines is forced to a voltage above a preset voltage; and
- opening said conductive paths when said first node is at said second voltage state.

* * * * *